United States Patent [19]

Eberhart

[11] Patent Number: 4,625,174

[45] Date of Patent: Nov. 25, 1986

[54] BATTERY AND BULB TESTER

[76] Inventor: Walter Eberhart, Landvogt Waser Strasse 33, Winterthur, Switzerland

[21] Appl. No.: 538,424

[22] Filed: Oct. 3, 1983

[30] Foreign Application Priority Data

Oct. 5, 1982 [CH] Switzerland .......................... 5853/82

[51] Int. Cl.[4] ...................... H01M 45/06; G01R 19/16
[52] U.S. Cl. .................................. 324/426; 324/73 R; 324/435; 340/636
[58] Field of Search ............... 324/426, 429, 432, 433, 324/435, 414, 73 R; 362/183; 339/152; 340/636; 320/48

[56] References Cited

U.S. PATENT DOCUMENTS

| | | | |
|---|---|---|---|
| 1,337,160 | 4/1920 | Riebeth | 324/426 |
| 2,155,778 | 4/1939 | Stratton | 324/73 R |
| 3,977,907 | 8/1976 | Roth | 339/152 |
| 4,020,243 | 4/1977 | Oldford | 324/426 |
| 4,027,231 | 5/1977 | Lohrmann | 324/433 |
| 4,177,500 | 12/1979 | Nicholl | 362/183 |

FOREIGN PATENT DOCUMENTS

| | | | |
|---|---|---|---|
| 1671712 | 10/1971 | Fed. Rep. of Germany | 324/426 |
| 2146050 | 3/1973 | Fed. Rep. of Germany | 324/426 |
| 0474078 | 10/1937 | United Kingdom | 324/426 |
| 2060181 | 4/1981 | United Kingdom | 324/426 |
| 2098745 | 11/1982 | United Kingdom | 324/426 |

*Primary Examiner*—Reinhard J. Eisenzopf
*Assistant Examiner*—Jose M. Solis
*Attorney, Agent, or Firm*—Roylance, Abrams, Berdo & Goodman

[57] ABSTRACT

An apparatus for testing a battery comprises a casing having an open cavity and electric contacts fixedly mounted in the cavity. An electric mechanism is housed in the casing for measuring battery voltage and indicating the voltage value measured. The battery is received in the cavity to position it properly relative to the contacts. The contacts are electrically coupled to the measuring and indicating mechanism, and are spaced to make electrical contact with the battery terminals. A light bulb can be tested optionally using the battery voltage.

4 Claims, 5 Drawing Figures

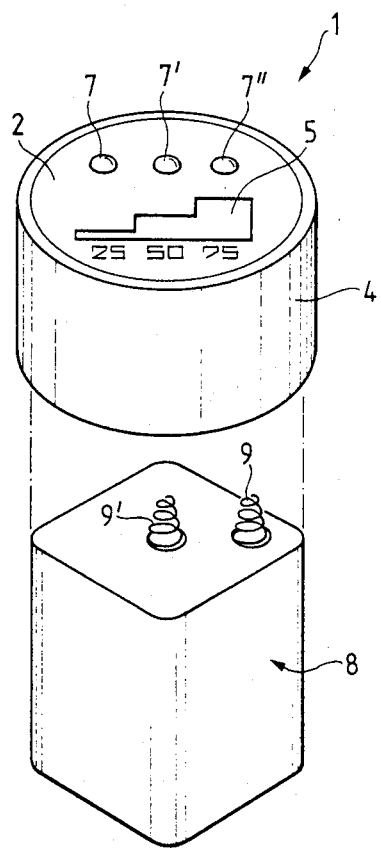
FIG. 1
FIG. 2
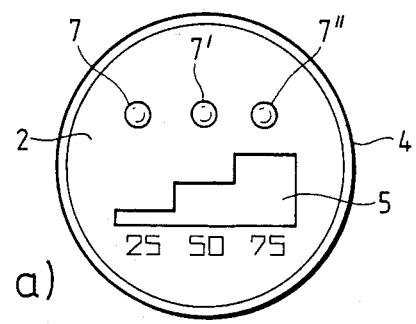
a)
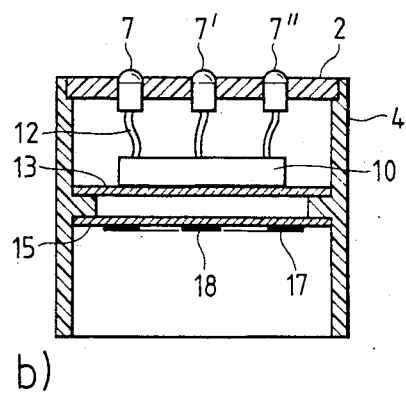
b)
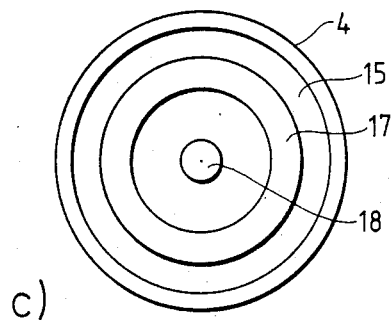
c)

BATTERY AND BULB TESTER

FIELD OF THE INVENTION

The present invention relates to an apparatus for testing a battery by measuring the voltage of the battery and indicating the voltage value measured.

BACKGROUND OF THE INVENTION

The condition of a battery can be tested with numerous different devices. Such devices determine the charge state or the remaining residual energy, particularly the voltage in the load condition. The required circuit for measuring the voltage under a suitable resistance load and for indicating the measured voltage, even for a rough quantitative indication, is conventional.

Conventional instruments of this type have one or two test leads for contacting the terminals of the battery to be tested. The load condition is then displayed by an indicator. The measurement or test procedure varies depending on the battery type, and specifically on how and where the battery terminals are accessible or can be contacted by the lead or leads.

Battery testers with two test leads are most commonly used. The polarity of the leads is determined by a color code. Improper polarity does not cause damage, but merely requires reversal of the connections between the leads and battery terminals.

Six volt batteries, e.g., those distributed under the name ICE 4 R 25, are very widely used for many purposes, particularly in building site marking lamps. The use in marking lamps is only one of the many large-scale uses of this successful battery type. As a result of widespread use, unskilled persons must be employed to test such batteries economically and determine which batteries requirement replacement. Use of unskilled labor requires simplification of the test procedure to minimize errors. In the case of building site marking lamps, proper testing is necessary to ensure adequate lighting during the hours of darkness for safety and to avoid discarding batteries which are adequately charged.

Conventional testing instruments are not satisfactory for such environments. The instruments are not sufficiently rugged to withstand the rigors of the construction industry. The two-handed operation with test leads is difficult to perform. If the leads are lost, they are merely replaced by any readily available wires tending to cause incorrect measurements. Since such instruments are difficult to use, they are often not used at all and the batteries are not tested, causing complete discharge of the batteries and failure of the lamp. Not infrequently, this creates a considerable safety risk.

SUMMARY OF THE INVENTION

Accordingly, an object of the present invention is to provide an apparatus for testing a battery which can be simply and reliably operated to determine the charge state of a battery without any possibility of faulty operation.

A further object of the present invention is to provide an apparatus for testing a battery which can be operated without the operator considering battery terminal arrangement or polarity and without using test leads.

Another object of the present invention is to provide an apparatus for testing a battery which does not require specific alignment and positioning of the apparatus relative to the battery terminals, while simultaneously permitting one-handed operation.

The foregoing objects are basically obtained by an apparatus for testing a battery comprising a casing having an open cavity and electric contacts fixedly mounted in the cavity. An electric mechanism is housed in the casing for measuring battery voltage and indicating the voltage value measured. The battery is received in the cavity to position it properly relative to the contacts. The contacts are electrically coupled to the measuring and indicating mechanism, and are spaced to make electrical contact with the battery terminals.

By forming the apparatus in this manner, a battery can be simply and reliably tested merely by placing the battery within the cavity with the battery terminals against the contacts. The engagement of the casing and battery properly positions the battery terminals with the proper polarity, and without using leads. The operation can be performed by unskilled workers with one hand.

Part of the casing can be placed over the battery to be tested with the test contacts located at a predetermined depth within the cavity of the casing. Additionally, the casing can be cylindrical and the contacts concentrically arranged. A central contact can be surrounded by an annular contact with the two contacts radially spaced from one another by a distance corresponding to the battery terminal spacing.

Advantageously, the test contacts are printed conductors of a printed circuit.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure:

FIG. 1 is a perspective view of a battery tester according to a first embodiment of the present invention;

FIG. 2a is a top plan view of the battery tester of FIG. 1;

FIG. 2b is a side elevational view in section of the battery tester of FIG. 1;

FIG. 2c is a bottom plan view of the battery tester of FIG. 1; and

DETAILED DESCRIPTION OF THE PREFERRED EMBODIMENTS OF THE THE INVENTION

Figure 3:
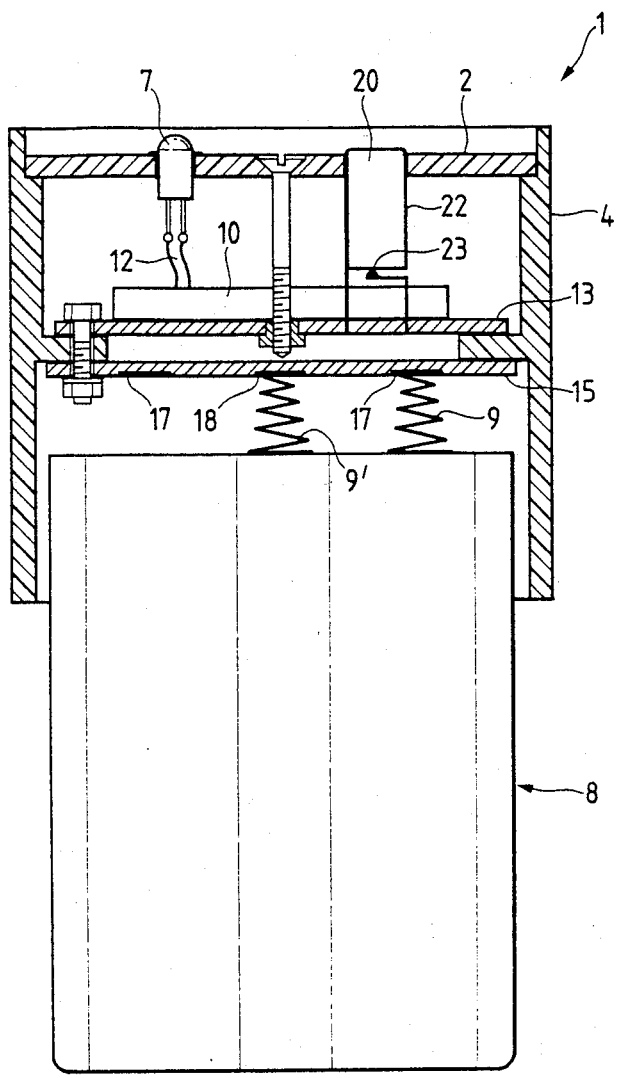
FIG. 3 is a side elevational view of in section of a battery tester according to a second embodiment of the present invention.

Referring to FIGS. 1, 2a, 2b and 2c, a conventional six volt battery 8 has a parallelepiped or prismatic shape with rounded longitudinal edges. The two terminals 9 and 9' are arranged on one end face and conventionally comprise contact wires bent to form conical spirals. This terminal shape is similar to that of a compression or tension spring for providing the necessary contact pressure despite slight misplacements of or flaws in the battery body. One terminal 9' is arranged in the center of the battery end face, while the second terminal 9 is arranged on a diagonal line extending through the center of the end face adjacent one of the four corners of the end face. The apparatus or battery tester 1 according to the present invention can be used for testing battery 8.

Battery tester 1 comprises a cylindrical casing 4 which houses an electronic circuit for measuring battery voltage and indicating the voltage value measured. The bottom of the casing has a downwardly opening cavity of predetermined depth. The top of the casing is covered by a front plate 2 on which is provided a scale 5 for evaluating actuation of indicators 7, 7', 7''. In the present embodiment, the indicators are three diodes arranged to indicate the battery's charge state, e.g., charge states of 25 to 50%, 50 to 75% and 75% and higher. Alternatively, the indicators can be labelled poor, moderate and good. Finer subdivisions would require a larger number of diodes, or a different type of indication. However, in order to provide maximum ruggedness and reliability, instruments with pointer mechanisms would not be suitable.

As depicted in FIG. 1, battery tester 1 can be loosely mounted over battery 8. The apparatus of the present invention is constructed such that it can be effortlessly placed over the battery, but with a limited amount of lateral play. The size of the casing is chosen such that approximately one third of the total height of the battery is covered by the casing. The casing must be able to be placed on and removed from the battery without using clips.

The arrangement of the test contacts is shown in FIGS. 2a, b and c. FIG. 2a shows front plate 2. Front plate 2 holds three light-emitting diodes 7, 7', 7'' which are connected by wires 12 to a conventional circuit 10 for measuring battery voltage and indicating the voltage value measured. Circuit 10 is arranged on a printed board 13 fixed in cylindrical casing 4. A support plate 15 with test contacts 17, 18 is also fixed in casing 4, the contacts being fixed at a certain depth within the casing cavity and electrically coupled to circuit 10. The specific arrangement of the test contacts is shown in FIG. 2c.

Test contacts 17, 18 are arranged concentrically relative to one another. Preferably, central contact 18 is the test contact for the central battery terminal 9' and annular contact 17 is the test contact to the corner battery terminal 9. The spacing of the test contacts, i.e., the radial spacing, essentially corresponds to the spacing of the two battery terminals. Annular contact 17 permits the apparatus to be placed in random manner on the battery without the operator considering the alignment of the test contacts and battery terminals, and permits rotation of the apparatus through a random angle, e.g., for taking a reading. Two or one-handed operation is permitted by the symmetrical arrangement of the casing and the test contacts therein. In this form, the apparatus has a very rugged construction.

As a function of the intended life and the intended price of the apparatus, the test contacts can be constructed as solid members fixed to a substrate, or can be integrated as printed conductors on a printed circuit board, the contact surfaces being galvanically provided with a hard coating.

FIG. 3 illustrates a battery tester according to a second embodiment of the present invention in the test position relative to battery 8. The second embodiment comprises a device 20 for testing bulbs normally used in conjunction with ICE 4 R 25 batteries. Device 20 is mounted in front plate 2 and has two contacts 22, 23 connected to the test contacts 17, 18. If there is a defect in the lamp bulb, it can be simultaneously checked with the battery. The battery to be tested supplies the current for the bulb checking operation.

While various embodiments have been chosen to illustrate the invention, it will be understood by those skilled in the art that various changes and modifications can be made therein without departing from the scope of the invention as defined in the appended claims.

What is claimed is:

1. An apparatus for testing a battery and a bulb, said battery having a pair of terminals on one axial end thereof, one of said terminals being located generally centrally of said battery axial end and the other of said terminals being located in predetermined spaced relation away from said centrally located terminal, electrical means for measuring battery voltage and for indicating the voltage value measured, said apparatus comprising a casing, means to mount said electrical means inside said casing, an open cavity formed in said casing, said open cavity being defined by a support plate and a lateral side wall of said casing, said electrical means comprising a pair of contacts, means to mount said pair of contacts on said support plate facing into said open cavity, said pair of contacts comprising a first contact generally centrally located on said support plate and a second annular shaped contact arranged concentrically around said first contact, the spacing of said first and second contacts corresponding to said predetermined spaced relation of said first and second battery terminals, said casing lateral wall having a size and shape with respect to the size and shape of said axial end of a said battery to be inserted into said open cavity that said battery terminals will contact said contacts in all possible orientations of said battery axial end as inserted into said open cavity, said casing comprising a front plate located in said casing in spaced relation to said support plate, socket means for testing a bulb, means to mount said bulb testing socket means in said front plate, means to mount said electrical battery voltage indicating means in said front plate, and means to electrically connect said bulb testing socket means to said pair of contacts, whereby the energy in a battery being tested is used to test a bulb put into said bulb testing socket means, whereby a battery and a bulb can be tested simultaneously, and whereby a bulb can be tested only when a battery is in said cavity in contact with said pair of contacts.

2. An apparatus according to claim 1, wherein said casing is cylindrical and said battery is of rectilinear shape.

3. An apparatus according to claim 2, wherein the diameter of said casing is substantially equal to the maximum transverse dimension of said battery axial end, whereby said battery axial end may be simply and quickly inserted into said apparatus for testing without the use of any clips, in a one hand operation, and with limited lateral play between said battery and said casing but with said battery free to rotate in said cavity.

4. An apparatus according to claim 1, wherein said pair of contacts are printed conductors.

* * * * *